United States Patent
Wu et al.

(10) Patent No.: US 6,743,685 B1
(45) Date of Patent: Jun. 1, 2004

(54) SEMICONDUCTOR DEVICE AND METHOD FOR LOWERING MILLER CAPACITANCE FOR HIGH-SPEED MICROPROCESSORS

(75) Inventors: David D. Wu, Austin, TX (US); Michael P. Duane, Round Rock, TX (US); Scott D. Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 17 days.

(21) Appl. No.: 09/784,629

(22) Filed: Feb. 15, 2001

(51) Int. Cl.⁷ ............................................. H01L 21/336
(52) U.S. Cl. ...................... 438/302; 438/301; 438/303; 438/289
(58) Field of Search ................................ 438/302, 301, 438/303, 289

(56) References Cited

U.S. PATENT DOCUMENTS

| | | | |
|---|---|---|---|
| 5,320,974 A | * | 6/1994 | Hori et al. .................. 437/44 |
| 5,360,751 A | * | 11/1994 | Lee ............................. 437/35 |
| 5,593,907 A | * | 1/1997 | Anjum et al. ................. 437/35 |
| 6,020,244 A | * | 2/2000 | Thompson et al. .......... 438/302 |
| 6,083,794 A | * | 7/2000 | Hook et al. ................. 438/286 |
| 6,103,562 A | * | 8/2000 | Son et al. .................... 438/217 |
| 6,255,175 B1 | * | 7/2001 | Yu ............................. 438/289 |
| 6,372,587 B1 | * | 4/2002 | Cheek et al. ................ 438/302 |

* cited by examiner

Primary Examiner—Phat X. Cao
(74) Attorney, Agent, or Firm—Williams, Morgan & Amerson

(57) ABSTRACT

A method is provided, the method including forming a gate dielectric above a surface of the substrate and forming a doped-poly gate structure above the gate dielectric, the doped-poly gate structure having an edge region. The method also includes forming a dopant-depleted-poly region in the cage region of the doped-poly gate structure adjacent the gate dielectric.

21 Claims, 15 Drawing Sheets

US 6,743,685 B1

SEMICONDUCTOR DEVICE AND METHOD FOR LOWERING MILLER CAPACITANCE FOR HIGH-SPEED MICROPROCESSORS

BACKGROUND OF THE INVENTION

1. Field of the Invention

This invention relates generally to semiconductor fabrication technology, and, more particularly, to a method of lowering and/or reducing the Miller capacitance at the edges of a structure such as a gate structure of a metal oxide semiconductor field effect transistor (MOSFET or MOS transistor).

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density and number of the transistors that can be produced on a given amount of wafer real estate, lowering the overall cost per transistor as well as the cost of integrated circuit devices incorporating such transistors.

However, reducing the channel length of a transistor also increases "short-channel" effects, almost by definition, as well as "edge effects" that are relatively unimportant in long channel transistors. Short-channel effects include, among other things, an increased drain-source leakage current when the transistor is supposed to be switched "off," believed to be due to an enlarged depletion region relative to the shorter channel length. One of the edge effects that may influence transistor performance is known as Miller capacitance. The Miller capacitance is an overlap capacitance that arises because the conductive doped-polycrystalline silicon (doped-poly) gate almost invariably overlaps, with a conductive portion of either the more heavily-doped source/drain regions or the less heavily-doped source/drain extension (SDE) regions, if present, of a conventional metal oxide semiconductor field effect transistor (MOSFET or MOS transistor).

As shown in FIG. 1, for example, a conventional MOS transistor 100 may be formed on a semiconducting substrate 105, such as doped-silicon. The MOS transistor 100 may have an $N^+$-doped-poly ($P^+$-doped-poly) gate 110 formed above a gate oxide 115 formed above the semiconducting substrate 105. The $N^+$-doped-poly ($P^+$-doped-poly) gate 110 and the gate oxide 115 may be separated from $N^+$-doped ($P^+$-doped) source/drain regions 120S and 120D of the MOS transistor 100 by dielectric spacers 125. The dielectric spacers 125 may be formed above $N^+$-doped ($P^+$-doped) source/drain extension (SDE) regions 130S and 130D. As shown in FIG. 1, shallow trench isolation (STI) regions 140 may be provided to isolate the MOS transistor 100 electrically from neighboring semiconductor devices such as other MOS transistors (not shown).

The $N^-$-doped ($P^-$-doped) SDE regions 130S and 130D are typically provided to reduce the magnitude of the maximum channel electric field found close to the $N^+$-doped ($P^+$-doped) source/drain regions 120S and 120D of the MOS transistor 100, and, thereby, to reduce the associated hot-carrier effects. The lower (or lighter) doping the $N^-$-doped ($P^-$-doped) SDE regions 130S and 130D, relative to the $N^+$-doped doped) source/drain regions 120S and 120D of the MOS transistor 100 (lower or lighter by at least a factor of two or three), reduces the magnitude of the maximum channel electric field found close to the $N^+$-doped ($P^+$-doped) source/drain regions 120S and 120D of the MOS transistor 100, but increases the source-to-drain resistances of the $N^-$-doped ($P^-$-doped) SDE regions 130S and 130D.

As shown in FIG. 1, typically there are overlap regions 135S and 135D (indicated in phantom) where the edges of the $N^+$-doped-poly ($P^+$-doped-poly) gate 110 overlap with the edges of the $N^-$-doped ($P^-$-doped) SDE regions 130S and 130D, respectively. The typical amount of overlap Δ in each of the overlap regions 135S and 135D, as shown in FIG. 1, may be about 200 Å, for example. As the overall dimensions of the MOS transistor 100 are reduced, the Miller capacitance becomes more of a dominant factor, particularly affecting the switching speed of the MOS transistor 100.

The drain overlap region 135D gives rise to the Miller capacitance, since the $N^+$-doped ($P^+$-doped) source region 120S is typically grounded and the voltage is usually applied to the $N^+$-doped ($P^+$-doped) drain region 120D to drive the source-to-drain current. Generally, the Miller capacitance refers to the capacitance between two terminals switching in opposite directions. For example, when the MOS transistor 100 is in an "off" state, there may be some residual charge (electrons, for an N-channel MOS transistor 100, and holes, for a P-chancel MOS transistor 100) stored in the drain overlap region 135D, primarily due to the Miller capacitance. This "Miller charge" must be discharged before the MOS transistor 100 may be switched from the "off" state to an "on" state, slowing down the switching speed. Similarly, the Miller capacitance in the overlap region 135D must be charged up again with the "Miller charge" after the MOS transistor 100 is switched from the "on" state to the "off" state, further slowing down the switching speed. When an N-channel MOS transistor 100 is in an "off" state, the voltage of the $N^+$-doped-poly gate 110 may be in a "low" or "0" state and the voltage of the $N^+$-doped drain region 120D, and, hence the $N^-$-doped SDE region 130D, may be in a "high" or "1" state. When the N-channel MOS transistor 100 is then switched to an "on" state, the voltage of the $N^+$-doped-poly gate 110 may go to a "high" or "1" state and the voltage of the $N^+$-doped drain region 120D, and, hence the $N^-$-doped SDE region 130D, may go to a "low" or "0" state (toward the "low" or "0" or grounded state of the $N^+$-doped source region 120S), as electrons flow in the source-to-drain direction through an inverted N-channel formed in the otherwise p-type semiconducting substrate 105. The $N^+$-doped-poly gate 110 and the $N^-$-doped SDE region 130D are capacitively coupled by the overlap capacitance (Miller capacitance) to the drain overlap region 135D. This overlap capacitance (Miller capacitance) in the drain overlap region 135D tends to resist the switching of the N-channel MOS transistor 100.

The present invention is directed to overcoming, or at least reducing the effects of, one or more of the problems set forth above.

SUMMARY OF THE INVENTION

In one aspect of the present invention, a method is provided, the method including forming a gate dielectric above a surface of the substrate and forming a doped-poly gate structure above the gate dielectric, the doped-poly gate structure having an edge region. The method also includes forming a dopant-depleted-poly region in the edge region of the doped-poly gate structure adjacent the gate dielectric.

In another aspect of the present invention, an MOS transistor having a reduced Millet capacitance is provided, the MOS transistor formed by a method including forming a gate dielectric above a surface of the substrate and forming a doped-poly gate structure above the gate dielectric, the doped-poly gate structure having an edge region. The method also includes forming a dopant-depleted-poly region in the edge region of the doped-poly gate structure adjacent the gate dielectric.

In yet another aspect of the present invention, an MOS transistor is provided, the MOS transistor including a gate dielectric above a surface of a substrate and a doped-poly gate structure above the gate dielectric, the doped-poly gate structure having an edge and an edge region. The MOS transistor also includes a dopant-depleted-poly region in the edge region of the doped-poly gate structure adjacent the gate dielectric.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
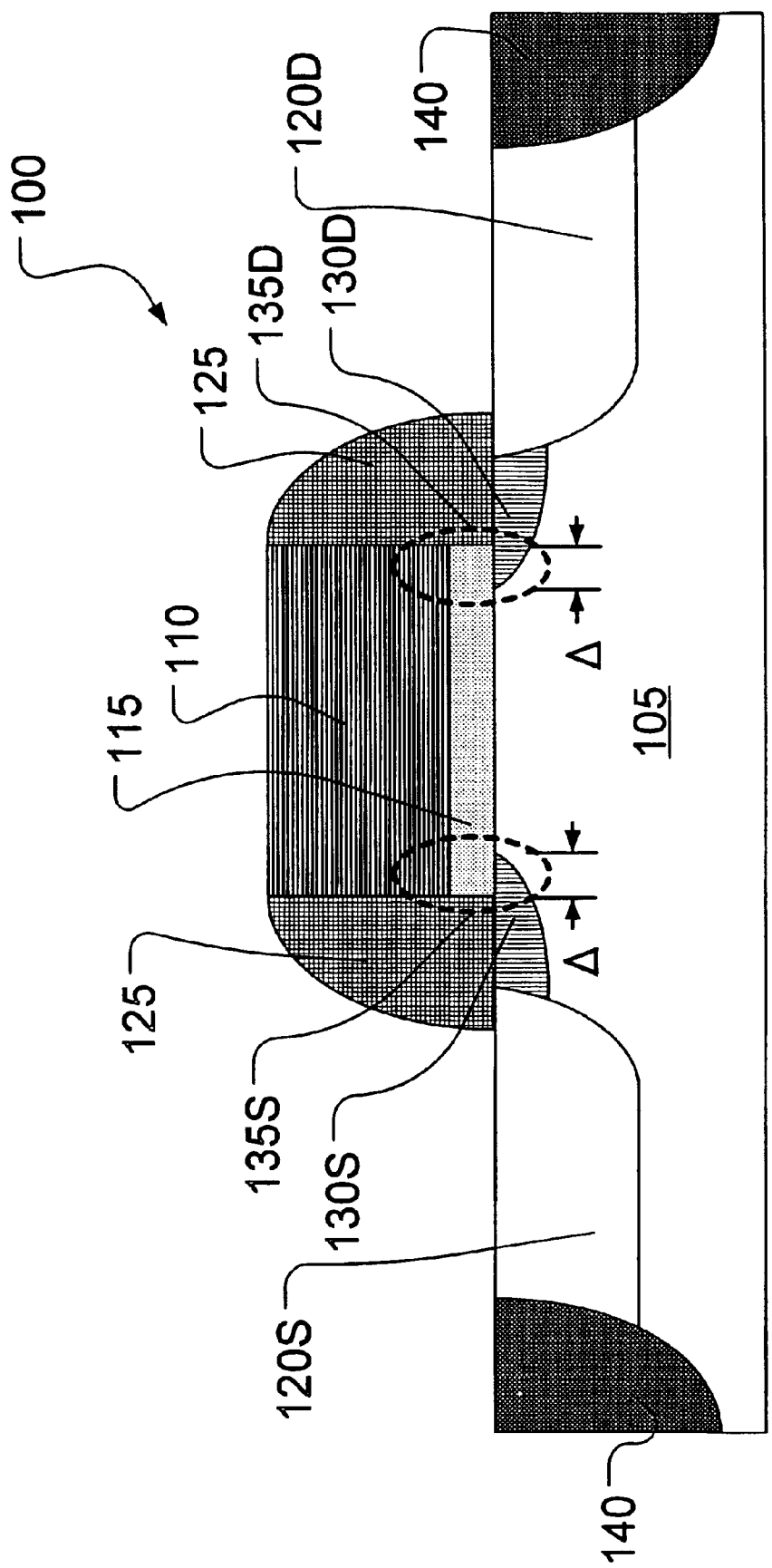
FIG. 1 illustrates schematically in cross-section a conventional MOS transistor having an uncompensated Miller capacitance.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 2–15. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the resent method is applicable to a variety of technologies, for example,. NMOS, PMOS, CMOS, and the like, and is readily applicable to a variety of devices, including, but not limited to, logic devices, memory devices, and the like.

Figure 2:
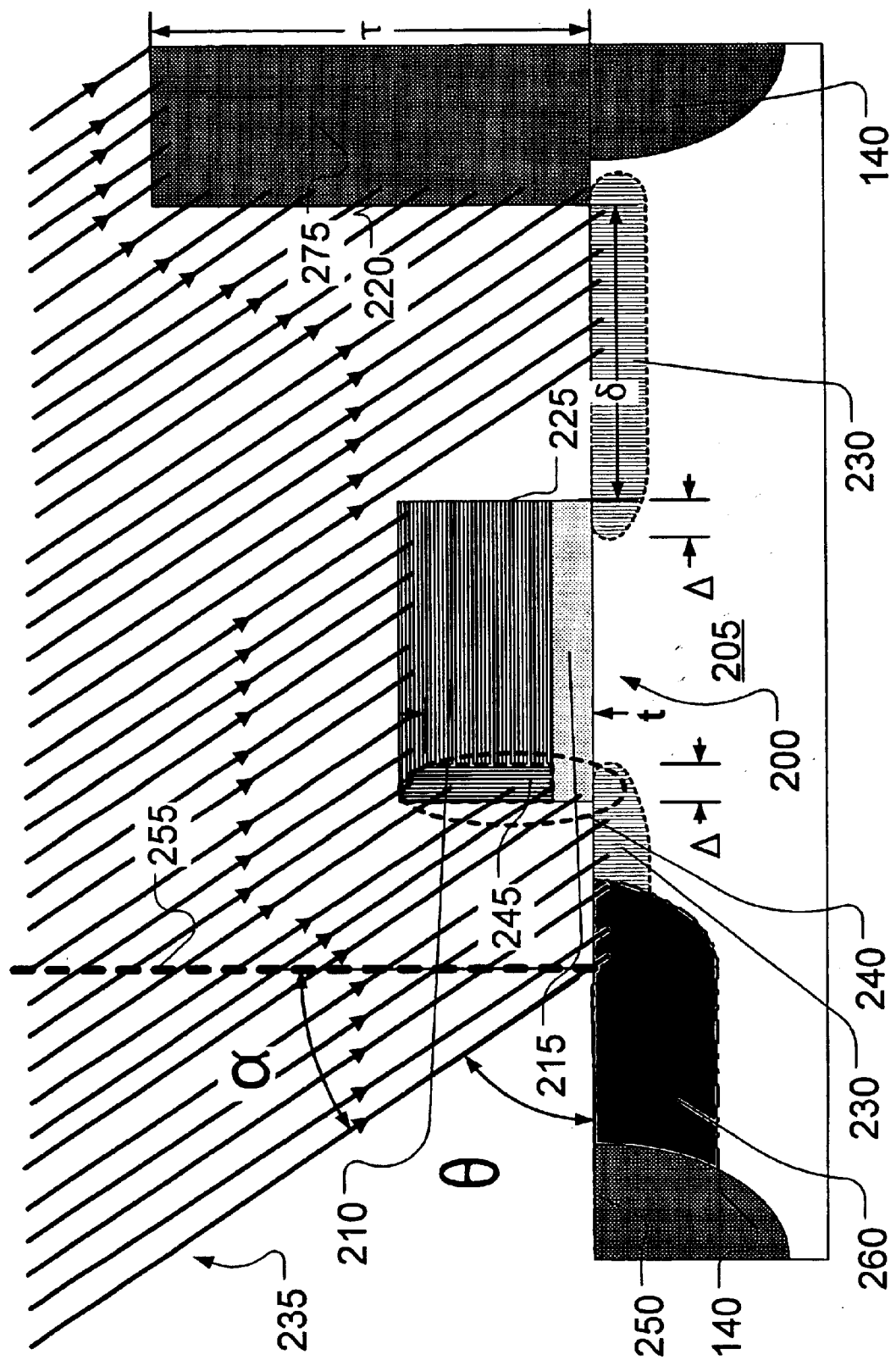
FIGS. 2–15 illustrate schematically in crass-section various embodiments of a method for semiconductor device fabrication according to the present invention.
Figure 12:
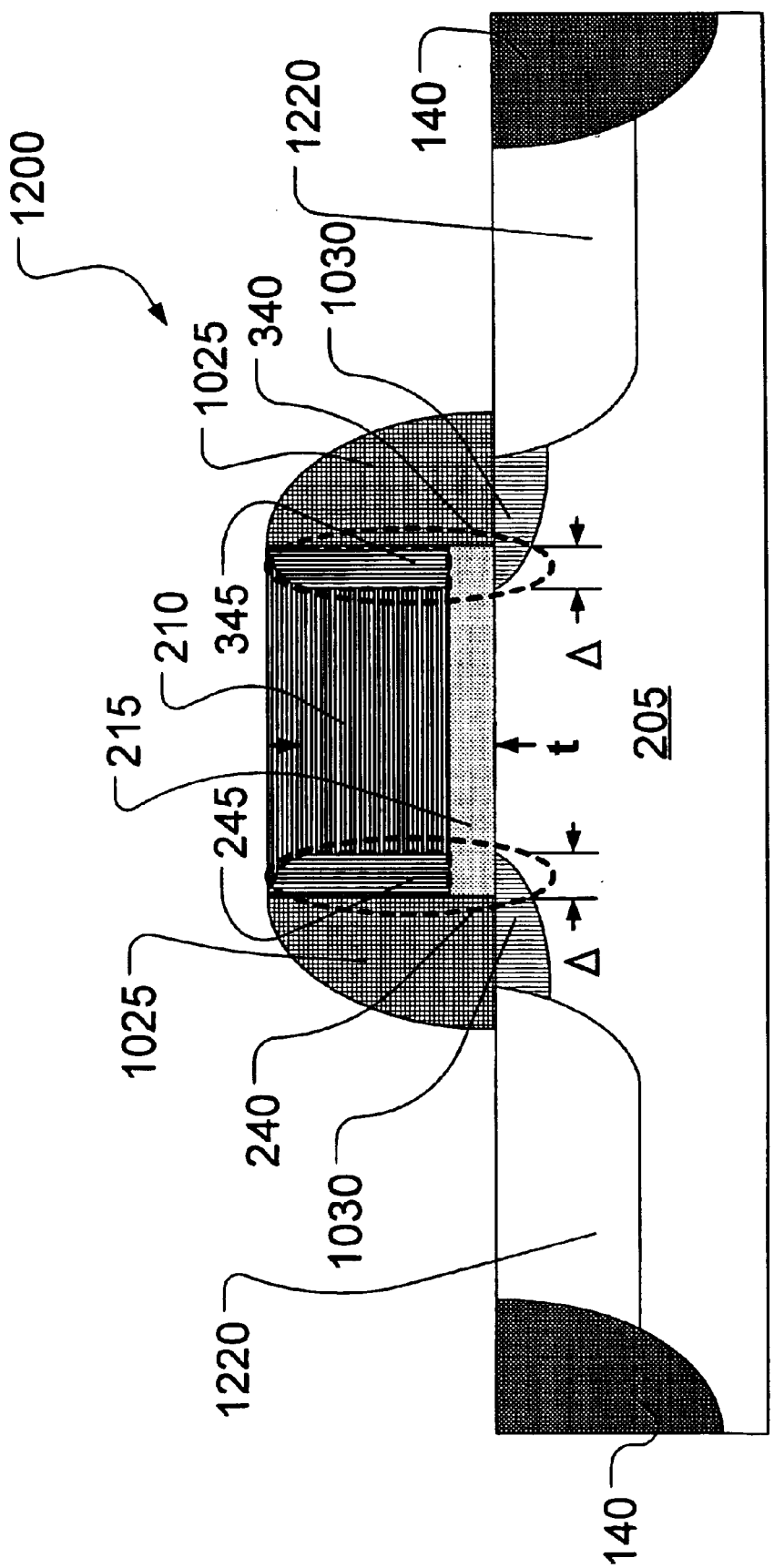

As shown in FIG. 2, an embodiment of a method for semiconductor device fabrication according to the present invention is schematically illustrated. A structure 200 (that will eventually become a gate structure for an MOS transistor such as the MOS transistor 1200, as shown in FIG. 12 and as described in more detail below), having a doped-poly gate 210 and a gate dielectric 215, may be formed above a semiconducting substrate 205, such is doped-silicon.

A source/drain extension (SDE) or lightly doped drain (LDD) mask 275 may be formed over a shallow trench isolation (STI) region 140, as in conventional CMOS fabrication methods, to protect the PMOS (NMOS) transistor regions while the NMOS (PMOS) transistor regions are being implanted to form the $N^-$-doped ($P^-$-doped) SDE regions 230 (outlined in phantom), for example. The mask 275 may be formed of photoresist, for example, and may have a thickness τ in a range of about 5000 Å–15000 Å. The mask 275 may have an edge 220 disposed a distance δ from an edge 225' of the structure 200. The edge 220 of the mask 275 may be spaced apart from the edge 225 of the structure 200 by the distance δ ranging from approximately 3000–8000 Å, for example.

As shown in FIG. 2, a counter-dopant 235 (indicated by directed lines) may be implanted to introduce counter-dopant atoms and/or molecules to reduce or deplete the overall doping of the doped-poly gate 210 in an overlap region 240 to form a dopant-depleted-poly (DDP) region 245. At the bottom of the doped-poly gate 210, adjacent the gate dielectric 215, the dopant concentration may be about $1.0 \times 10^{19}$–$2.0 \times 10^{19}/cm^3$ of the appropriate dopant atoms and/or molecules, e.g., arsenic (As) or phosphorus (P) for an illustrative NMOS transistor, or boron (B) or boron difluoride ($BF_2$) for an illustrative PMOS transistor. The counter-dopant 235, of the appropriate counter-dopant atoms and/or molecules, e.g., B or $BF_2$ for an illustrative NMOS transistor, or As or P for an illustrative PMOS transistor, implanted into the doped-poly gate 210 in the overlap region 240 reduces the overall-doping in the dopant-depleted-poly (DDP) region 245, reducing the Miller capacitance in the overlap region 240.

The Miller capacitance per unit area C=K/t, where K is the effective dielectric constant of the less conductive region between the conductive layers that give rise to the Miller capacitance in the overlap region 240, and t is the thickness of the less conductive region. Without the dopant-depleted-poly (DDP) region 245, the thickness t would only be the thickness of the gate dielectric 215, whereas with the dopant-depleted-poly (DDP) region 245, the thickness t increases in the overlap region 240, causing the Miller capacitance per unit area C=K/t in the overlap region 240 to decrease.

An angle θ of the counter-dopant 235 with respect to an upper surface 250 of the semiconducting substrate 205 may lie within a range of about 45°–83°. Similarly, as shown in FIG. 2, the angle α of the counter-dopant 235 with respect to a direction 255 (indicated in phantom) substantially perpendicular (or normal) to the upper surface 250 of the semiconducting substrate 205 may lie within a range of about 7°–45°. Generally, the angle α is complementary to the angle θ, so that α+θ=90.0°.

The semiconducting substrate 205 may be tilted at the angle θ with respect to a horizontal direction in an implanter (not shown) and the counter-dopant 235 may be directed. downward in a vertical direction. Alternatively, the semiconducting substrate 205 could be disposed in the horizontal direction in the implanter (not shown) are the counter-dopant 235 could be directed downward at the angle θ with respect to the horizontal direction in the implanter, and/or any other combination of tilt and implant direction could be used as long as the angle θ is the relative angle of the counter-dopant 235 with respect to the upper surface 250 of the semiconducting substrate 205.

Figure 3:
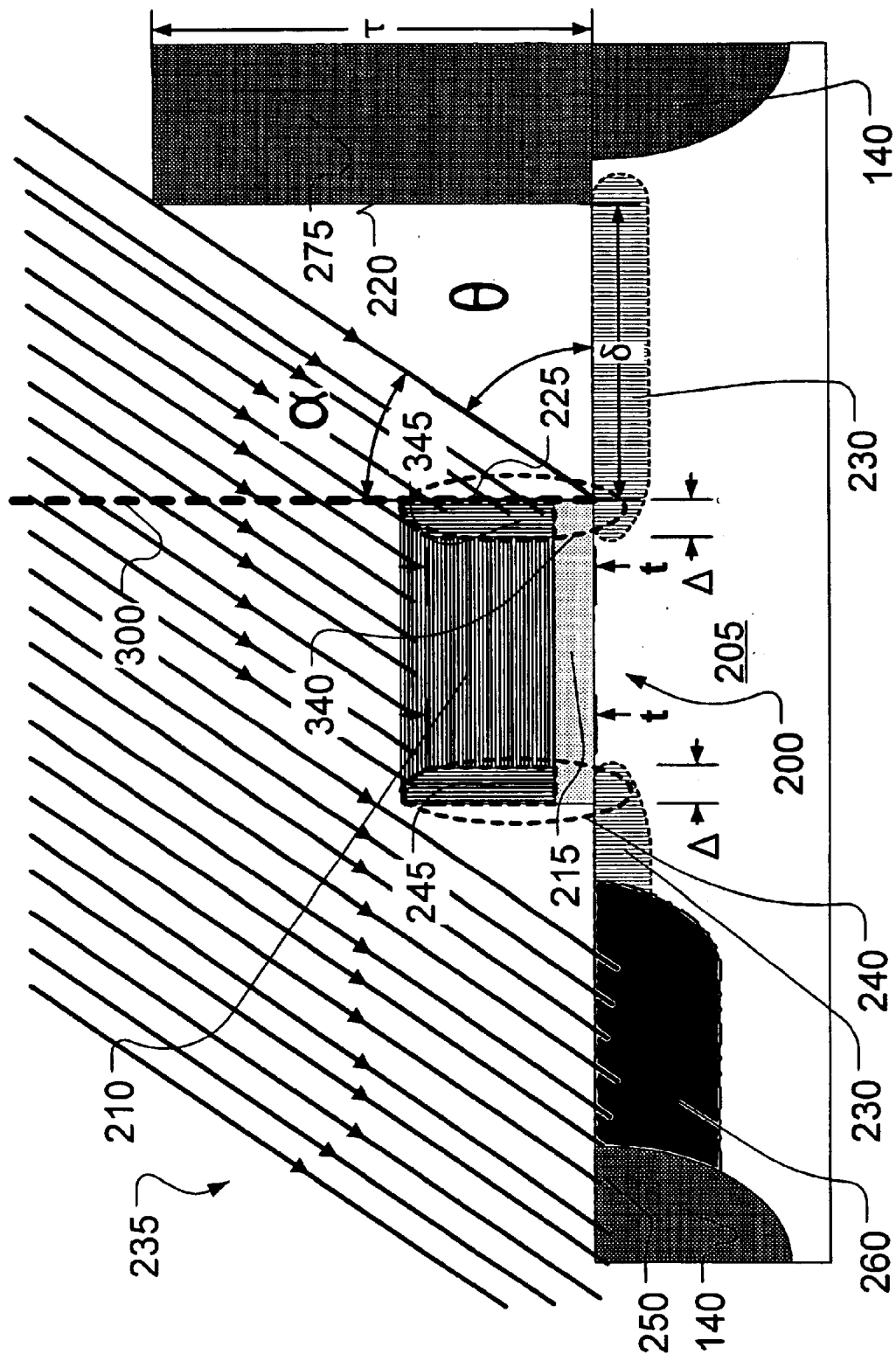

As shown in FIG. 3, after implanting one side of the structure 200, the semiconducting substrate 205 may be rotated through 90°, and/or 180°, and/or 270°, and the counter-dopant 235 may again be implanted to introduce counter-dopant, atoms and/or molecules to reduce or deplete the overall doping of the doped-poly gate 210 in an overlap region 340 to form a dopant-depleted-poly (DDP) region 345. The counter-dopant 235 may again be implanted so that the angle θ is the relative angle of the counter-dopant 235 with respect to the upper surface 250 of the semiconducting substrate 203. As shown in FIG. 3, the angle θ of the counter-dopant 235 with respect to the upper surface 250 of the semiconducting substrate 205 may lie within a range of about 45°–83°. Similarly, as shown in FIG. 3, the angle α of the counter-dopant 235 with respect to a direction 300 (indicated in phantom) substantially perpendicular (or normal) to the upper surface 250 of the semiconducting substrate 205 may lie within a range of about 7°–45°. The angle α is again complementary to the angle θ, so that α+θ=90.0°.

In various illustrative embodiments, a dose of the counter-dopant 235 atoms and/or molecules may range from approximately $0.5 \times 10^{15}$–$2.0 \times 10^{15}$ ions/cm² of the appropriate counter-dopant 235 atoms and/or molecules, e.g., B or $BF_2$ for an illustrative NMOS transistor (the p-type counter-dopant serving to reduce or deplete the n-type doping of the doped-poly gate 210 of the NMOS transistor), or As or P for as illustrative PMOS transistor (the n-type counter-dopant serving to reduce or deplete the p-type doping of the doped-only gate 210 of the PMOS transistor). An implant energy of the counter-dopant 235 atoms and/or molecules may range from approximately 0.5–5 keV, suitable for a shallow implant. The amount of overlap Δ in the overlap regions 240 and 340, as shown in FIGS. 2 and 3, may only be in a range of about 100–300 Å, for example, so the counter-dopant 235 implant may not need to be any deeper than about 200 Å.

In one illustrative embodiment, a dose of the counter-dopant 235 atoms is approximately $0.5 \times 10^{15}$ ions/cm² of B for an NMOS transistor at an implant energy of approximately 0.5 keV or approximately $0.5 \times 10^{15}$ ions/cm² of As for a PMOS transistor at an implant energy of approximately 4 keV. In another illustrative embodiment a dose of the counter-dopant 235 atoms is approximately $0.5 \times 10^{15}$ ions/cm² of $BF_2$ for an NMOS transistor at an implant energy of approximately 2.0 keV or approximately $0.5 \times 10^{15}$ ions/cm² of P for a PMOS transistor at an implant energy of approximately 1.5 keV. Generally, the implant energy may scale as $\epsilon = \epsilon_{boron} m_{dopant}/m_{boron}$ or $\epsilon = \epsilon_{boron} A_{dopant}/10.81$, where $A_{dopant}$ is the atomic mass of the dopant (or counter-dopant) atom and/or molecule. The depth of the counter-dopant 235 implant in the dopant-depleted-poly (DDP) region 345 in various illustrative embodiments, measured from the edge 225 of the structure 200, may range from approximately 50–100 Å, approximately, equal to about half the amount of overlap Δ.

By way of contrast, a typical dose of dopant for the N⁻-doped (P⁻-doped) SDE region 230 may range from approximately $0.5 \times 10^{15}$–$3.0 \times 10^{15}$ ions/cm² of the appropriate dopant atoms and/or molecules, e.g., As or P for an illustrative NMOS transistor or B or $BF_2$ for an illustrative PMOS transistor. An implant energy of the N⁻-doped (P⁻-doped) SDE region 230 dopant atoms and/or molecules may range from approximately 3–20 keV. Similarly, a typical dose or dopant for the N⁺-doped (P⁺-doped) source region 260 (shown in phantom on the left-hand side or the substrate 205 in FIGS. 2 and 3) may range from approximately $1.0 \times 10^{15}$–$5.0 \times 10^{15}$ ions/cm² of the appropriate dopant atoms and/or molecules, e.g., As or P for an illustrative NMOS transistor or B or $BF_2$ for an illustrative PMOS transistor. An implant energy of the N⁺-doped (P⁺-doped) source region 260 dopant atoms and/or molecules may range from approximately 30–100 keV.

Figure 4:
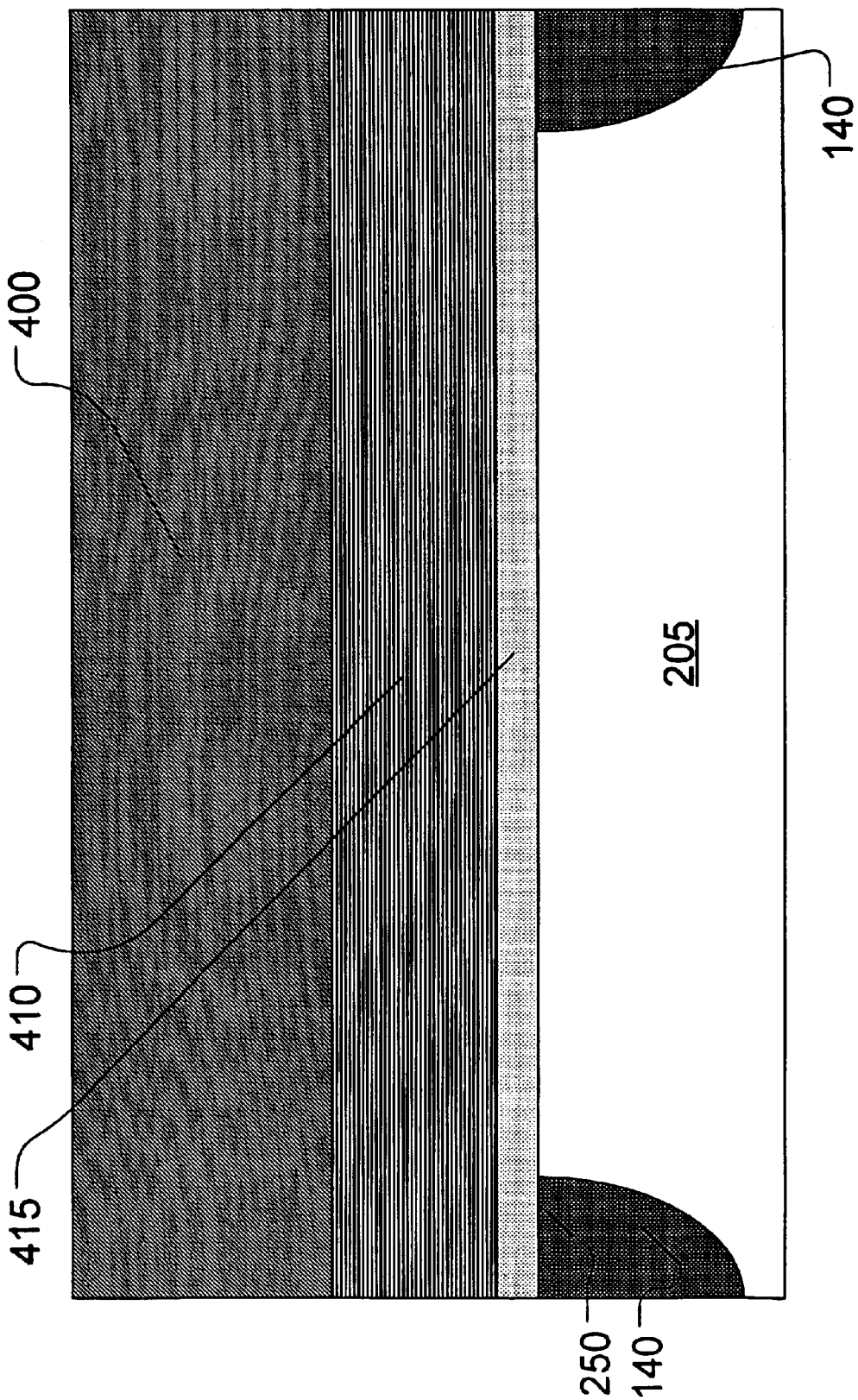

The counter-dopant 235 may be an N⁻ implant such as P, As, antimony (Sb), bismuth (Bi), and the like and may form the dopant-depleted-poly (DDP) regions 245 and 345 appropriate for the fabrication of PMOS transistor 1200, for example. Alternatively, the counter-dopant 235 may be a P⁻ implant such as B, boron fluoride (BF, $BF_2$), gallium (Ga), Indium (In), Thallium (Tl), and the like, and may form, the dopant-depleted-poly (DDP) regions 245 and 345 appropriate for the fabrication of an NMOS transistor 1200, for example, FIGS. 4–12 illustrate a method of forming the MOS transistor 1200 (FIG. 12) according to the present invention. As shown in FIG. 4, a dielectric layer 415 may be formed above an upper surface 250 of a semiconducting substrate 205, such as doped-silicon The dielectric layer 415 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 415 may have a.thickness above the upper surface 250 ranging from approximately 15–50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 415 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 415 may have an equivalent oxide thickness $t_{ox-eq}$ ranging from approximately 15–50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}4$, approximately. For example, the dielectric layer 415 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{op-eq}/K_{ox}=24t_{ox-eq}/4$, approximately, an equivalent oxide thickness $t_{ox-eq}$ ranging from approximately 15–50 Å would correspond to a $Ta_2O_5$ thickness $t_{TaO}$ ranging from approximately 90–300 Å.

As shown in FIG. 4, a doped-poly layer 410 may be formed above the dielectric layer 415. The doped-poly layer 410 may be formed by a variety of known techniques for forming such layers, e.g., CVD, LPCVD, PECVD, PVD, and the like, and, may have a thickness ranging from approximately 500–5000 Å. In one illustrative embodiment, the doped-poly layer 410 has a thickness of approximately 2000 Å and is formed by an LPCVD process for higher throughput.

The doped-poly layer 410 may doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000–2000 Å, for example. The doping of the poly may conveniently be accomplished by diffusing or implanting the dopant atoms and/or molecules through the upper surface of the poly. The doped-poly layer 410 may then be subjected to a heat-treating process that may be a rapid thermal anneal (RTA) process performed at a temperature ranging from approximately 800–1100° C. for a time ranging from approximately 5–60 seconds.

As shown in FIG. 4, a layer 400 of photoresist, for example, may be formed above the doped-poly layer 410. The photoresist layer 400 may have a thickness ranging from approximately 5000–15000 Å, for example.

Figure 5:
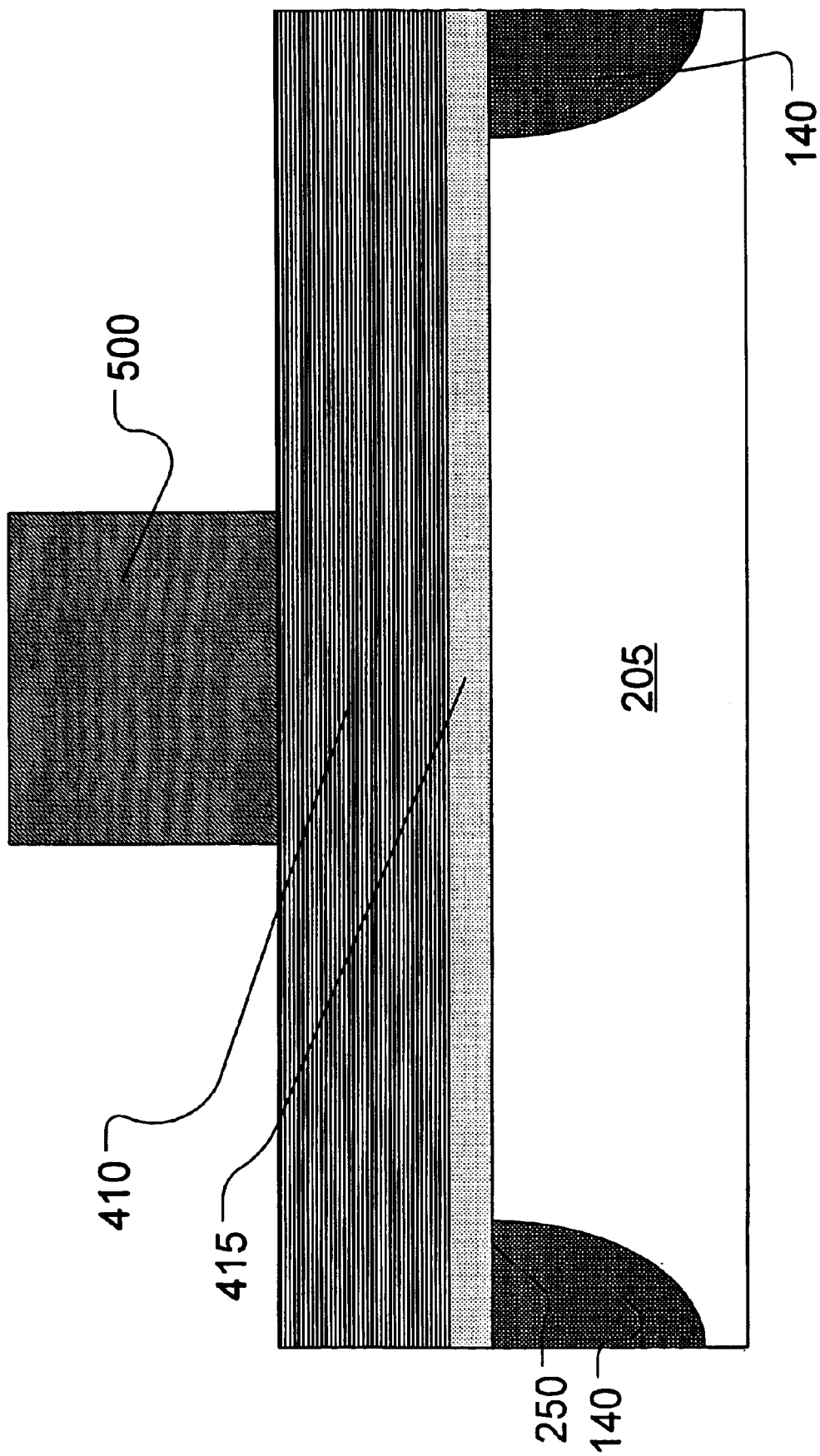
Figure 6:
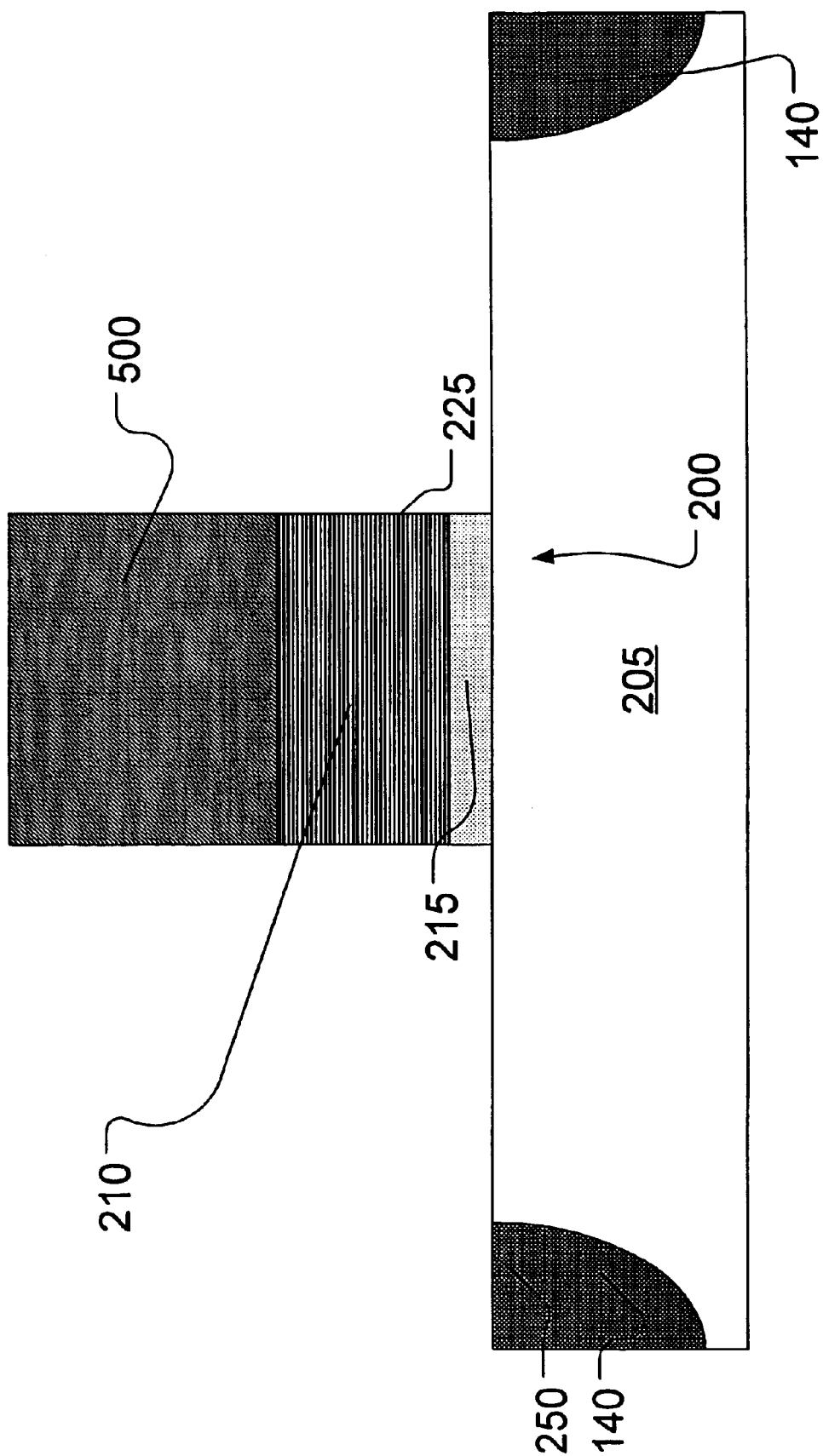
Figure 7:
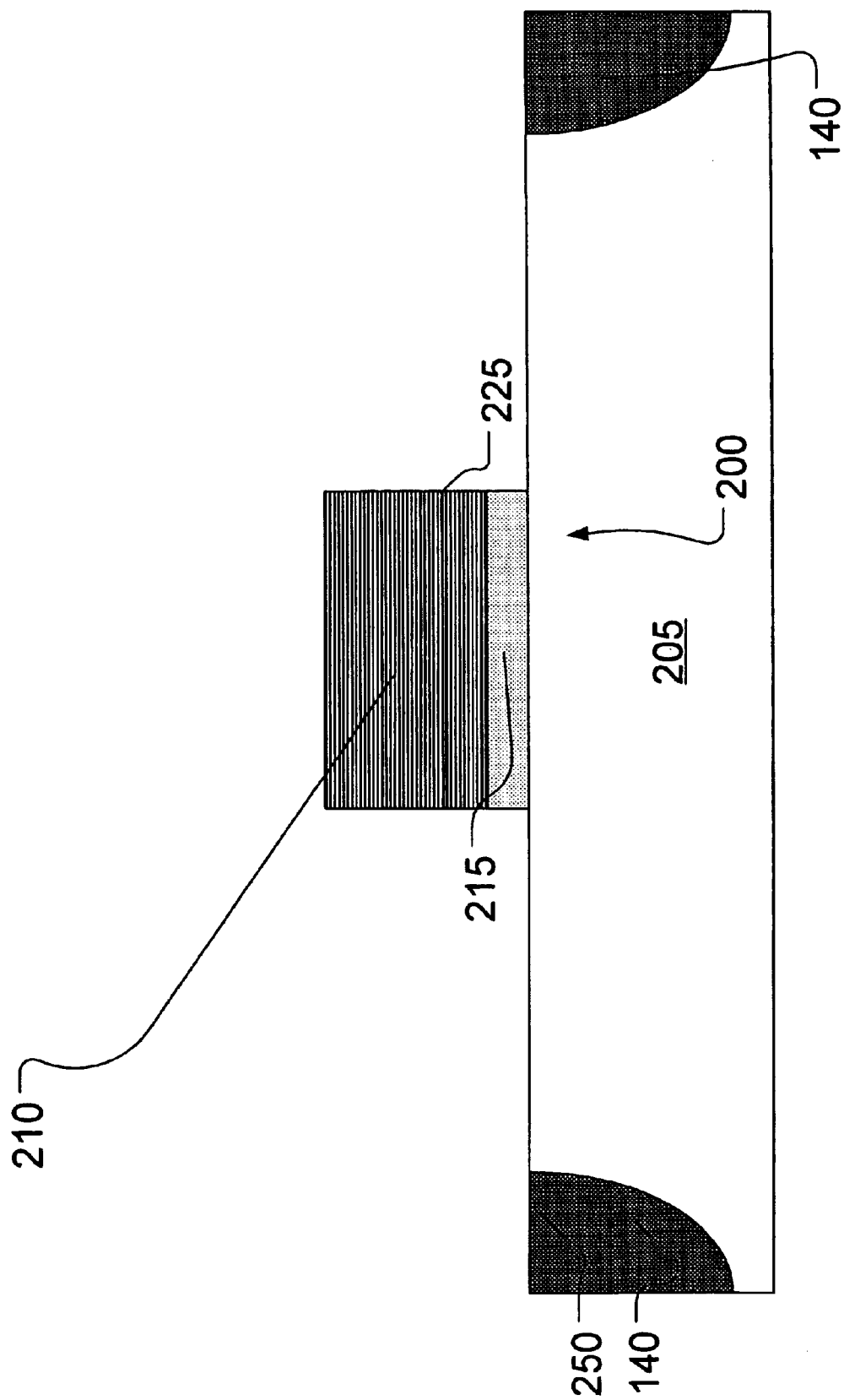

As shown in FIG. 5, the photoresist layer 400 (FIG. 4) may be patterned to form photoresist mask 500 above the doped-poly layer 410. As shown in FIGS. 5–6, portions of the doped-poly layer 410 and the dielectric layer 415 not protected by the photoresist mask 500 may be removed, by being etched away, for example, forming the structure 200. As shown in FIGS. 5–6, the structure 200 may be formed using a variety of known photolithography and etching techniques, such as an anisotropic etching process using hydrogen bromide (HBr) and argon (Ar) as the etchant gases, for example. As shown in FIG. 7, the photoresist mask 500 (FIGS. 5–6) may be removed by being stripped away for example.

Figure 8:
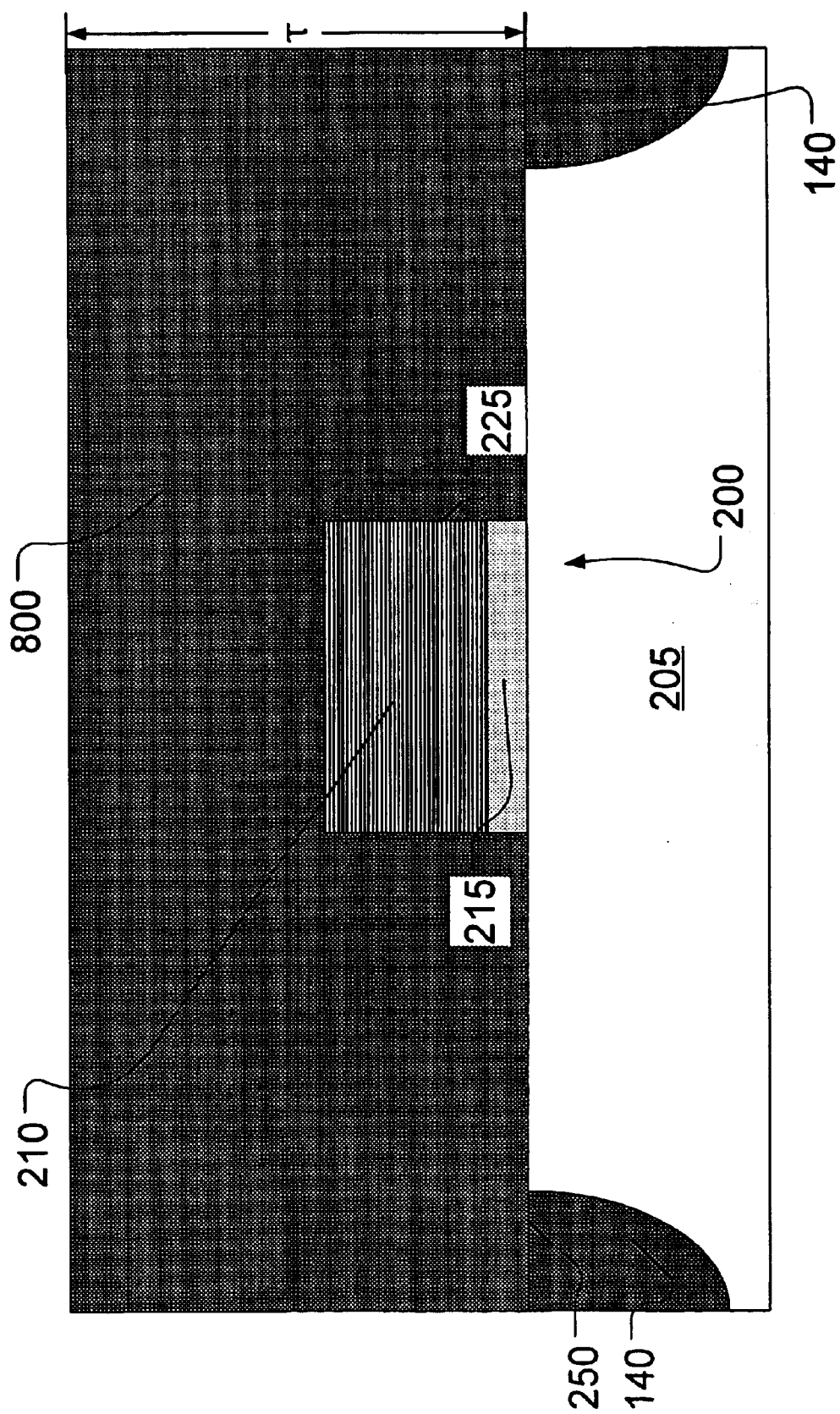

As shown in FIG. 8, a masking layer 800, formed of photoresist, for example, may be formed above the upper surface 250 of the semiconducting substrate 205, and above and adjacent the structure 200. The masking layer 800 may have a thickness $\tau$ above the upper surface 250 ranging from approximately 5000–15000 Å, for example. In various illustrative embodiments, the thickness $\tau$ above the upper surface 250 about 5000 Å. In various alternative illustrative embodiments, the thickness $\tau$ above the upper surface 250 ranges from approximately 10000–15000 Å.

Figure 9:
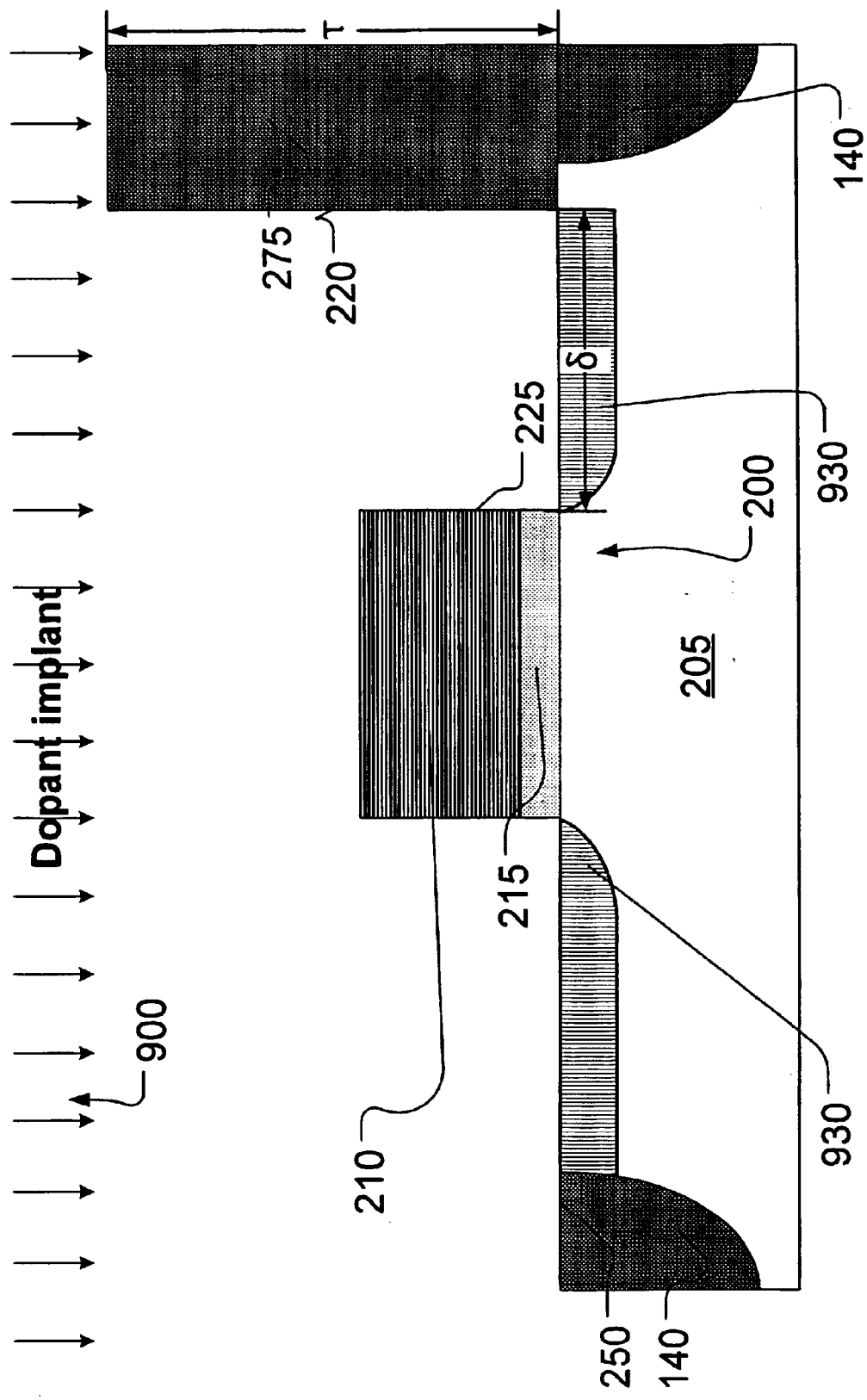

As shown in FIG. 9, the masking layer 800 may be patterned to form the mask 275 above at least a portion of the shallow trench isolation (STI) 140. The masking layer 800 may be patterned to form the mask 275 using a variety of known photolithography and/or etching techniques. The mask 275 may have an edge 220 spaced apart from an edge 225 of the structure 200 by a distance $\delta$ ranging from approximately 3000–8000 Å, for example.

The mask 275 may be formed over the STI region 140, as in conventional CMOS fabrication methods, to protect the PMOS (NMOS) transistor regions while the NMOS (PMOS) transistor regions are being implanted to form $N^-$-doped ($P^-$-doped) regions 930, for example. As shown in FIG. 9, a dopant implant 900 (indicated by the arrows) may be implanted to form the $N^-$-doped ($P^-$-doped) regions 930 either before or after the counter-dopant 235 (indicated by the directed lines in FIGS. 2–3) is implanted to introduce dopant atoms and/or molecules to form the dopant-depleted poly (DDP) regions 245 and 345. (FIG. 3). After activation, the $N^-$-doped ($P^-$-doped) regions 930 become the $N^-$-doped ($P^-$-doped) SDE regions 1030 (FIG. 10).

In various illustrative embodiments, the $N^-$-doped ($P^-$-doped) regions 930 may be formed by being implanted with an SDE dose of As (for $N^-$-doping appropriate for an NMOS transistor 1200) or B or $BF_2$ (for $P^-$-doping appropriate for a PMOS transistor 1200). The SDE dose may range from about $1.0 \times 10^{14} - 2.0 \times 10^{15}$ ions/cm$^2$ at an implant energy ranging from about 3–10 keV. The $N^-$-doped ($P^-$-doped) regions 930 may be subjected an RTA process performed at a temperature ranging from approximately 800–1100° C. for a time ranging from approximately 1–60 seconds. The RTA process may activate the implant and form a relatively sharply defined implant junction with the substrate 205.

Figure 10:
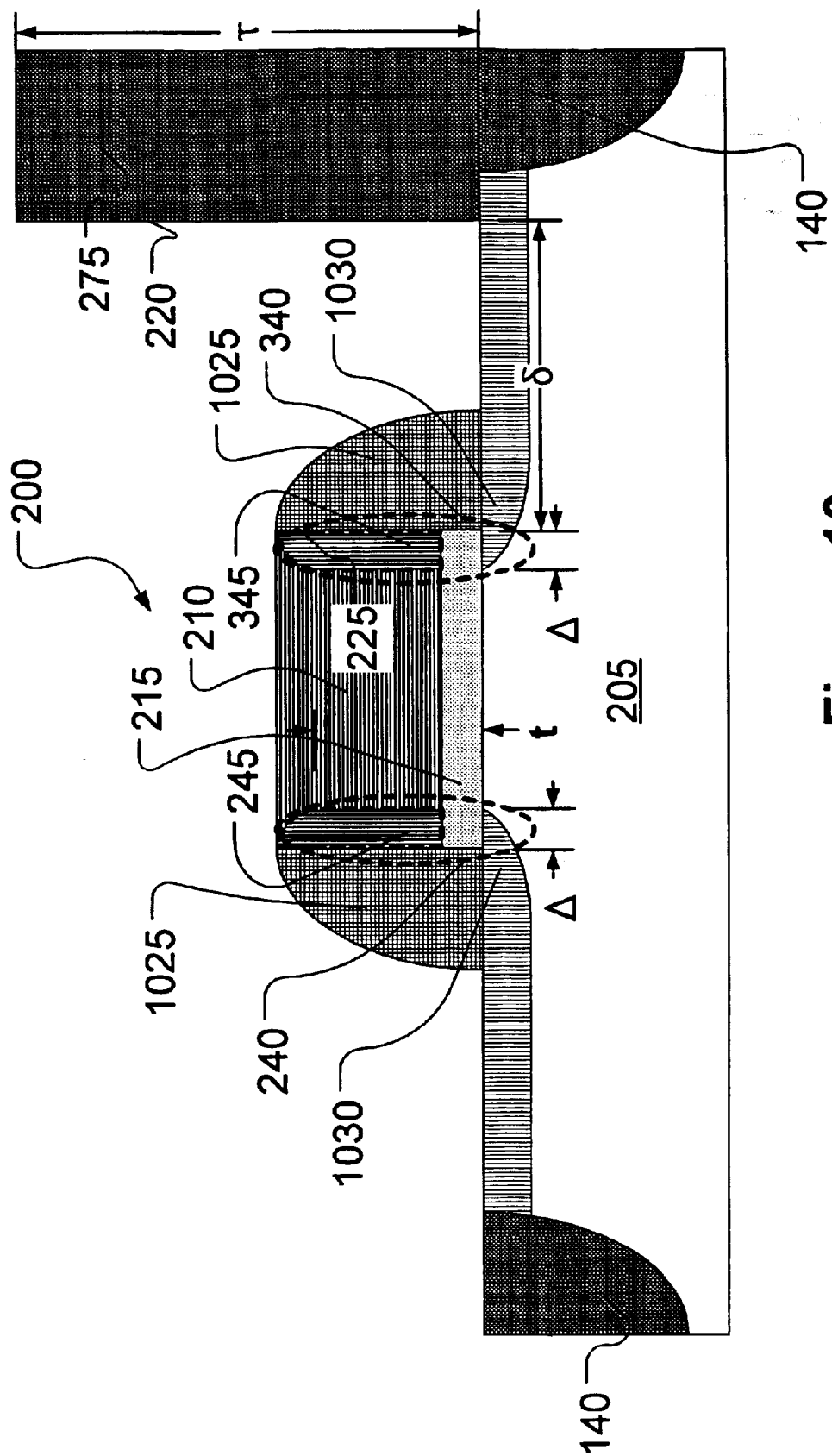

As shown in FIGS. 9–10, either before or after the dopant implant 900 (indicated by the arrows) to form the $N^-$-doped ($P^-$-doped) regions 930, the acts schematically illustrated in FIGS. 2–3, and described above, may form the dopant-depleted-poly (DDP) regions 245 and 345. As shown in FIG. 10, dielectric spacers 1025 may be formed adjacent the structure 200, either before or after the $N^-$-doped ($P^-$-doped) regions 930 are activated to become the $N^-$-doped ($P^-$-doped) SDE regions 1030.

In various alternative embodiments, after the dopant implant 900 (indicated by the arrows) to form the $N^-$-doped ($P^-$-doped) regions 930, the dopant-depleted-poly (DDP) regions 245 and 345 may be formed by enhancing dopant loss from the overlap regions 249 and 340 of the doped-poly gate 210. For example, certain, processing steps may cause dopant atoms and/or molecules from the overlap region 340 to migrate preferentially to the edge 225 of the structure 200 and/or may cause dopant atoms and/or molecules from the overlap region 340 of the of the doped-poly gate 210 to become electrically inactive very near the edge 225 of the structure 200. For example, the use of nitride and/or nitrided dielectric. spacers 1025 (FIG. 10), may affect the active dopant concentrations near the overlap regions 240 and 340 of the doped-poly gate 210, effectively leading to the formation of the dopant-depleted-poly (DDP) regions 245 end 345, as shown in FIG. 10. Nitrogen (N) from nitride and/or nitrided dielectric spacers 1025 may be acting as a counter-dopant in the case of a PMOS transistor 1200, the N effectively neutralizing the p-type doping near the overlap regions 240 and 340 of the p-type doped-poly gate 210 for a PMOS transistor 1200, for example.

As shown in FIG. 10, dielectric spacers 1025 may be formed by a variety of techniques above the $N^-$-doped ($P^-$-doped) SDE regions 1030 and adjacent the structure 200. For example, the dielectric spacers 1025 may be formed by depositing a conformal layer (not shown) of the appropriate material above and adjacent the structure 200, and then performing an anisotropic RIE process on the conformally blanket-deposited layer. The dielectric spacers 1025 may each have a base thickness ranging from approximately 300–1500 Å, for example, measured from the edge 225 of the structure 200. The dielectric spacers 1025, like the gate dielectric 215, may be formed from a variety of dielectric materials and may, for example, be an oxide (e.g., Ge oxide), silicon dioxide ($SiO_2$), nitrogen bearing $SiO_2$, silicon nitride ($Si_3N_4$), silicon oxynitride ($Si_xO_yN_z$), and the like. The dielectric spacers 1025 may also be formed of any suitable "low dielectric constant" or "low K" material, where K is less than or equal to about 4. Additionally, the dielectric spacers 1025 may to comprised of a fluorine-doped oxide, a fluorine-doped nitride, a fluorine-doped oxynitride, a fluorine-doped low K material, and the like. In one illustrative embodiment, the dielectric spacers 1025 are comprised of $SiO_2$.

Figure 11:
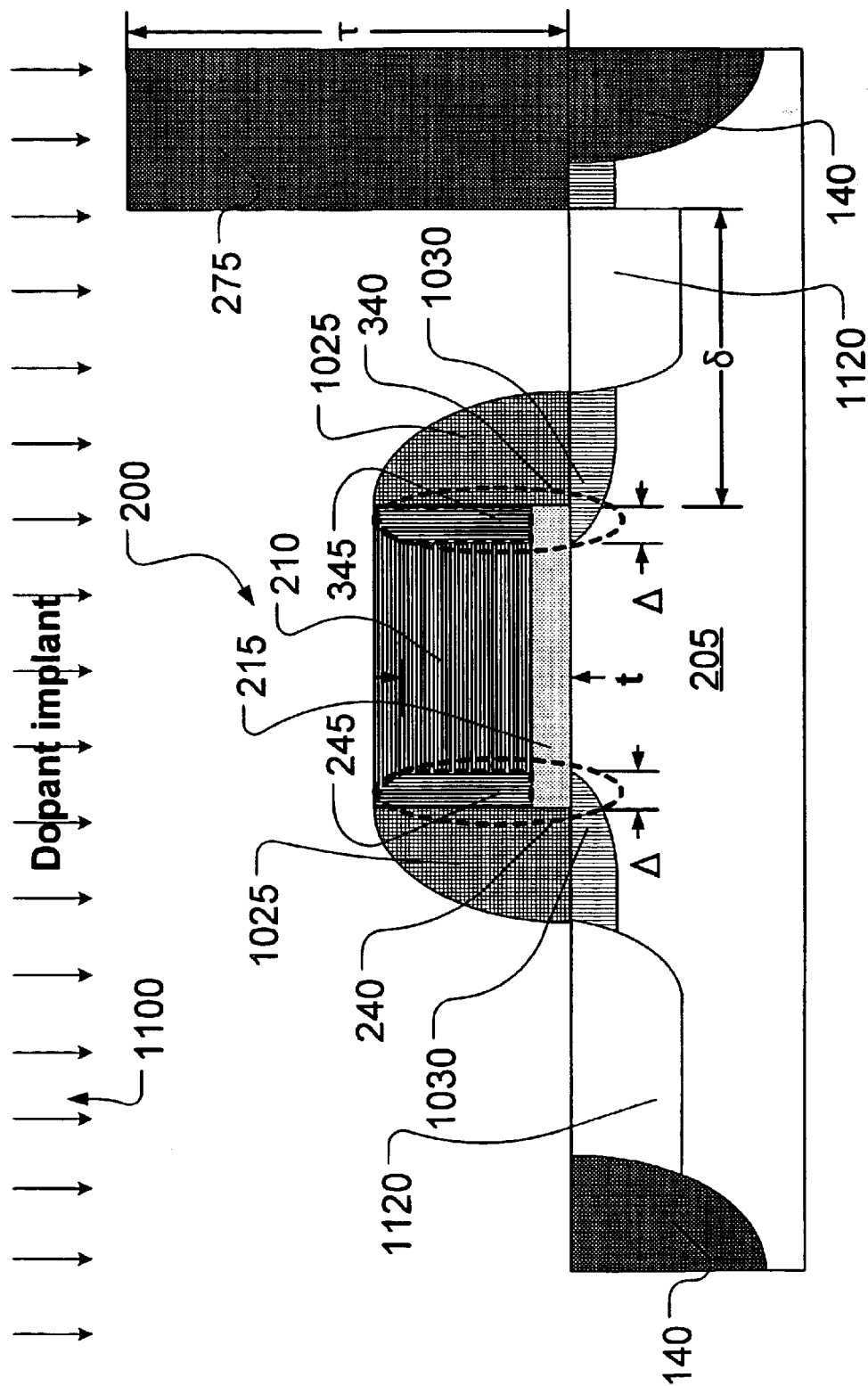

As shown in FIG. 11, a dopant 1100 (indicated by arrows) may be implanted to introduce dopant atoms and/or molecules to form $N^+$-doped ($P^+$-doped) regions 1120. After activation, the $N^+$-doped ($P^+$-doped) regions 1120 become $N^+$-doped ($P^+$-doped) source/drain regions 1220 (FIG. 12). In one illustrative embodiment, a dose of the dopant 1100 atoms and/or molecules may range from approximately $1.0 \times 10^{15} - 5.0 \times 10^{15}$ ions/$cm^2$ of the appropriate dopant 1100 atoms and/or molecules, e.g., P for an illustrative NMOS transistor or B for an illustrative PMOS transistor. An implant energy of the dopant 1100 atoms and/or molecules may range from approximately 20–100 keV. In another illustrative embodiment, dose of the dopant 1100 atoms is approximately $1.0 \times 10^{15}$ ions/$cm^2$ of P for an NMOS transistor or B for a PMOS transistor at an implant energy of approximately 30 keV.

The dopant 1100 may be an $N^+$ implant such as P, As, antimony, (Sb), and the like, and may form heavily, doped $N^+$ source/drain regions 1220. An $N^+$-implant would be appropriate for the fabrication of an NMOS transistor 1200, for example. Alternatively, the dopant 1100 may be a $P^+$ implant such as B, boron fluoride (BF, $BF_2$), aluminum (Al), gallium (Ga), Indium (In), and the like, and may farm heavily doped. $P^+$source drain regions 1220. A $P^+$implant would be appropriate for the fabrication of a PMOS transistor 1200, for example.

As shown in FIG. 12, the $N^+$-doped ($P^+$-doped) regions 1120 may be subjected to an RTA process performed at a temperature ranging from approximately 800–1100° C. for a time ranging from approximately 5–60 seconds to form the $N^+$-doped ($P^+$-doped) source/drain regions 1220. The RTA process may activate the implant of the more mobile P (for $N^+$-doping appropriate for an NMOS transistor 1200) or B (for $P^+$-doping appropriate for a PMOS transistor 1200).

Alternatively, an RTA process to diffuse and activate the $N^+$-doped ($P^+$-doped) regions 1120 to form the $N^+$-doped ($P^+$-doped) source/drain regions 1220 may be performed in conjunction with a self-aligned silicidation (silicidation) process (not shown), either prior to, during or following the silicidation. Such a silicidation-conjoined RTA process may be performed at a temperature ranging from approximately 800–1000° C. for a time ranging from approximately 10–60 seconds.

Figure 13:
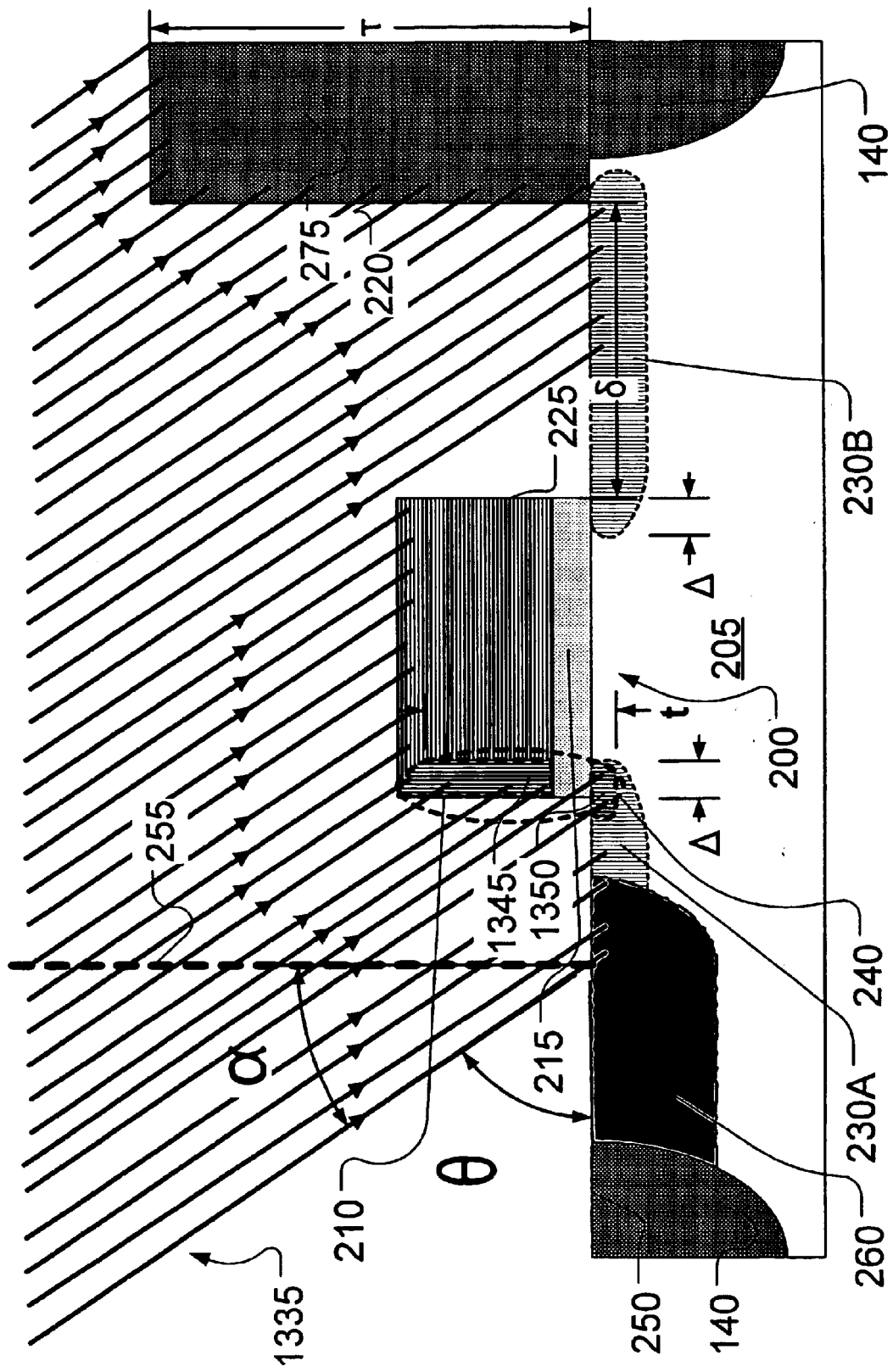
Figure 15:
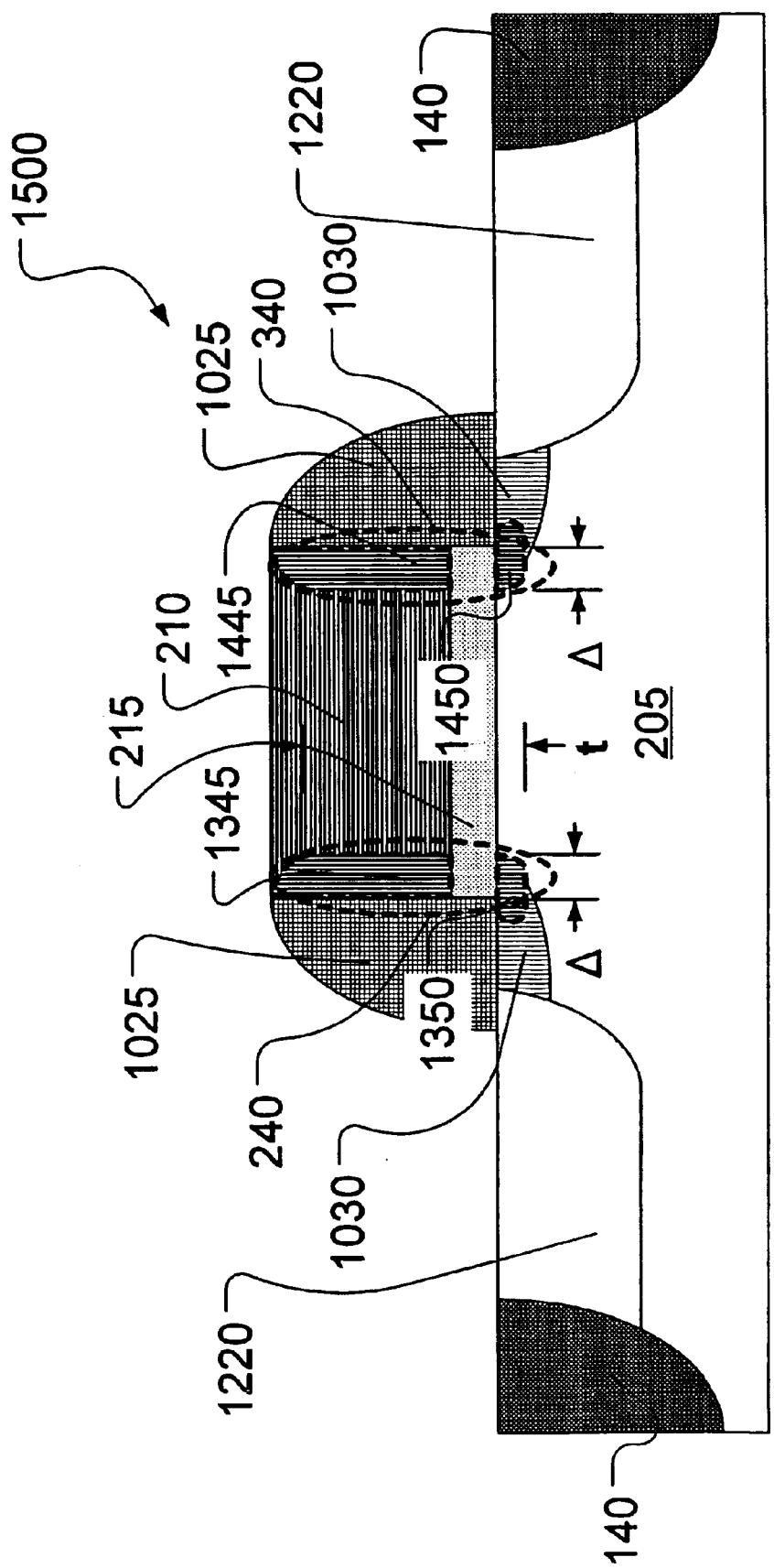

As shown in FIG. 13, an alternative embodiment of a method for semiconductor device fabrication according to the present invention is schematically illustrated. The structure 200 (that will eventually become a gate structure for an MOS transistor such as the MOS transistor 1500 as shown in FIG. 15 and as described in more detail below having the doped-poly gate 210 and the gate dielectric 215, may be formed above the semiconducting substrate 205, such as doped-silicon.

The source/drain extension (SDE) or lightly doped drain (LDD) mask 275 may be formed over the shallow trench isolation (STI) region 140, as in conventional CMOS fabrication methods, to protect the PMOS (NMOS) transistor regions white the NMOS (PMOS) transistor regions are being implanted to form the $N^-$-doped ($P^-$-doped) SDE regions 230 (outlined in phantom), for example. The mask 275 may be formed of photoresist, for example, and may have a thickness τ in a range of about 5000 Å–15000 Å. The mask 275 may have the edge 220 disposed a distance δ from the edge 225 of the structure 200. The edge 220 of the mask 275 may be spaced apart from the edge 225 of the structure 200 by the distance δ ranging from approximately 3000–8000 Å, for example.

As shown in FIG. 13, a counter-dopant 1335 (indicated by directed lines) may be implanted to introduce counter-dopant atoms and/or molecules to reduce or deplete the overall doping of the doped-poly gate 210 in an overlap region 240 to form a dopant-depleted-poly (DDP) region 1345. At the bottom of the doped-poly gate 210, adjacent the gate dielectric 215, the dopant concentration may be about $1.0 \times 10^{18} - 1.0 \times 10^{19}$/$cm^3$ of the appropriate dopant atoms and/or molecules, e.g., arsenic (As) or phosphorus (P) for an illustrative NMOS transistor or boron (B) or boron difluoride ($BF_2$) for an illustrative PMOS transistor. The counter-dopant 1335, of the appropriate counter-dopant atoms and/or molecules, e.g., B or $BF_2$ for an illustrative NMOS transistor, or As or P for an illustrative PMOS transistor, implanted into the doped-poly gate 210 in the overlap region 240 reduces the overall doping in the dopant-depleted-poly (DDP) region 1345, reducing the Miller capacitance in the overlap region 240.

As shown in FIG. 13, the counter-dopant 1335 may also, and substantially simultaneously, be implanted to introduce counter-dopant atoms and/or molecules into the substrate 205 to reduce or deplete the overall doping of the $N^-$-doped ($P^-$-doped) SDE region 230A in the overlap region 240 to form a dopant-depleted-SDE (DDSDE) region 1350. An implant energy of the counter-dopant 1335 atoms and/or molecules may range from approximately 0.2–5 keV, a low energy suitable for a very shallow implant. At the end portion of the $N^-$-doped ($P^-$-doped) SDE region 230A, the dopant concentration may be about $1.0 \times 10^{19} - 5.0 \times 10^{20}$/$cm^3$ of the appropriate dopant atoms and/or molecules, e.g., arsenic (As) or phosphorus (P) for an illustrative NMOS transistor, or boron (B) or boron difluoride ($BF_2$) for an illustrative PMOS transistor. The counter-dopant 1335, of the appropriate counter-dopant atoms and/or molecules, e.g., B or $BF_2$ for an illustrative NMOS transistor, or As or P for an illustrative PMOS transistor, implanted into the substrate 205 into the $N^-$-doped ($P^-$-doped) SDE region 230A in the overlap region 240 reduces the overall doping in the dopant-depleted-SDE (DDSDE) region 1350, further reducing the Miller capacitance in the overlap region 240.

The Miller capacitance per unit area $C=K/t$, where K is the effective dielectric constant of the less conductive region between the conductive layers that give rise to the Miller capacitance in the overlap region 240, and t is the effective thickness of the less conductive region. Without the dopant-depleted-only (DDP) region 1345 and the dopant-depleted-SDE (DDSDE) region 1350, the thickness t would only be the thickness of the gate dielectric 215, whereas with the dopant-depleted-poly (DDP) region 1345 and the dopant-depleted-SDE (DDSDE) region 1350, the thickness t increases in the overlap region 240, causing the Miller capacitance per unit area $C=K/t$ in the overlap region 240 to decrease.

An angle θ of the counter-dopant 1335 with respect to an upper surface 250 of the semiconducting substrate 205 may lie within a range of about 45°–83°. Similarly, as shown in FIG. 2, the angle α of the counter-dopant 1335 with respect to a direction 255 (indicated in phantom) substantially perpendicular (or normal) to the upper surface 250 of the semiconducting substrate 205 may lie within a range of about 7°–45°. Generally, the angle α is complementary to the angle θ, so that α+θ=90.0°.

The semiconducting substrate 205 may be tilted at the angle θ with respect to a horizontal direction in an implanter (not shown) and the counter-dopant 1335 may be directed downward in a vertical direction. Alternatively, the semiconducting-substrate 205 could be disposed in the horizontal direction in the implanter (not shown) and the counter-dopant 1335 could be directed downward at the angle θ with respect to the horizontal direction in the implanter, and/or any other combination of tilt and implant direction could be used as long as the angle θ is the relative angle of the counter-dopant 1335 with respect to the upper surface 250 of the semiconducting substrate 205.

Figure 14:
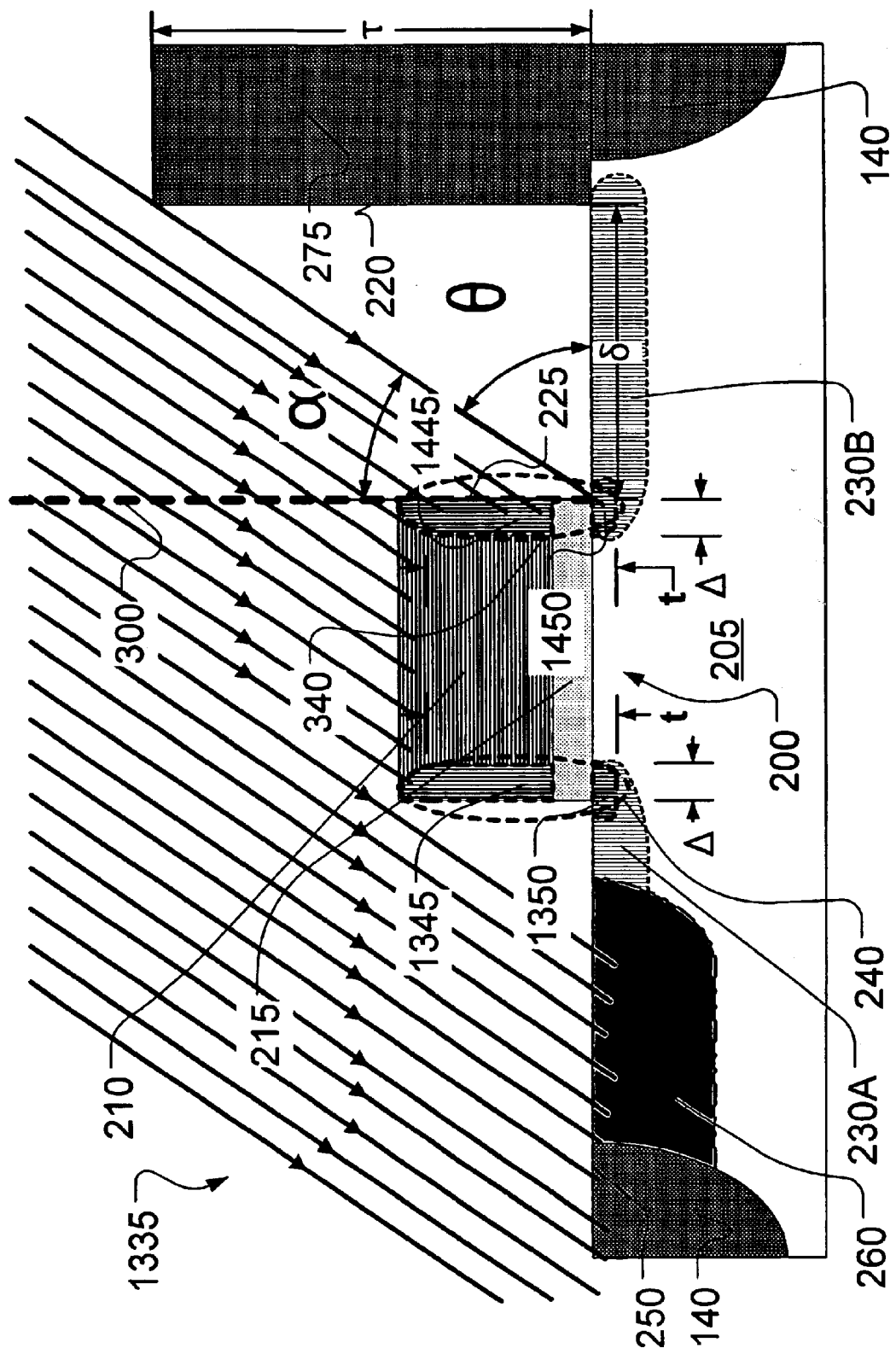

As shown in FIG. 14, after implanting one side of the structure 200, the semiconducting substrate 205 may be rotated through 90°, and/or 180°, and/or 270°, and the counter-dopant 1335 may again be implanted to introduce counter-dopant atoms and/or molecules to reduce or deplete the overall doping of the doped-poly gate 210 in an overlap region 340 to form a dopant-depleted-poly (DDP) region 1445. Similarly, as shown in FIG. 14, the counter-dopant 1335 may again be implanted to introduce counter-dopant atoms and/or molecules to reduce or deplete the overall doping of the N⁻-doped (P⁻-doped) SDE region 230B in the overlap region 340 to form a dopant-depleted-SDE (DDSDE) region 1450.

The counter-dopant 1335 may again be implanted so that the angle θ is the relative angle of the counter-dopant 1335 with respect to the upper surface 250 of the semiconducting substrate 205. As shown in FIG. 14, the angle θ of the counter-dopant 1335 with respect to the upper surface 250 of the semiconducting substrate 205 may lie within a range of about 45°–83°. Similarly, as shown in FIG. 14, the angle α of the counter-dopant 1335 with respect to a direction 300 (indicated in phantom) substantially perpendicular (or normal) to the upper surface 250 of the semiconducting substrate 205 may lie within a range of about 7°–45°. The angle α is again complementary to the angle θ, so that α+θ=90.0°.

In various illustrative embodiments, a dose of the counter-dopant 1335 atoms and/or molecules may range from approximately $1.0 \times 10^{14}$ –$1.0 \times 10^{15}$ ions/cm² of the appropriate counter-dopant 1335 atoms and/or molecules, e.g., B or $BF_2$ for an illustrative NMOS transistor (the p-type counter-dopant serving to reduce or deplete the n-type doping of the doped-poly gate 210 and the N-doped SDE region 230 of the NMOS transistor) or As or P for an illustrative PMOS transistor (the n-type counter-dopant serving to reduce or deplete the p-type doping or the doped-poly gate 210 and the P⁻-doped SDE region 230 of the PMOS transistor). An implant energy of the counter-dopant 1335 atoms and/or molecules may range from approximately 0.2–5 keV, suitable for a very shallow implant. The amount of overlap Δ in the overlap regions 240 and 340, as shown in FIGS. 13 and 14, may only be in a range of about 100–300 Å, for example, so the counter-dopant 1335 implant may not need to be any deeper than about 200 Å.

In one illustrative embodiment, a dose of the counter-dopant 1335 atoms is approximately $1.0 \times 10^{14}$ ions/cm² of B for an NMOS transistor at an implant energy of approximately 0.2 keV or approximately $1.0 \times 10^{14}$ ions/cm² of As for a PMOS transistor at an implant energy of approximately 2 keV. In another illustrative embodiment, a dose of the counter-dopant 1335 atoms is approximately $1.0 \times 10^{14}$ ions/cm² of $BF_2$ for an NMOS transistor at an implant energy of approximately 1.0 keV or approximately $1.0 \times 10^{13}$ ions/cm² of P for a PMOS transistor at an implant energy of approximately 0.5 keV. Generally, the implant energy may scale as $\epsilon = \epsilon_{boron} m_{dopant}/m_{boron}$ or $\epsilon = \epsilon_{boron} A_{dopant}/10.81$, where $A_{dopant}$ is the atomic mass of the dopant (or counter-dopant) atom and/or molecule. The depth of the counter-dopant 1335 implant in the dopant-depleted-poly (DDP) region 1445 and in the DDSDE region 1450 in various illustrative embodiments, measured from the edge 225 of the structure 200, may range from approximately 50–100 Å, approximately equal to about half the amount of overlap Δ.

The counter-dopant 1335 may be an N⁻ implant such as P, As, antimony (Sb), bismuth (Bi), and the like, and may form the dopant-depleted-poly (DDP) regions 1345 and 1445, and the DDSDE regions 1350 and 1450, appropriate for the fabrication of a PMOS transistor 1500, as shown in FIG. 15, for example. Alternatively, the counter-dopant 1335 may be a P⁻ implant such as B, boron fluoride (BF, $BF_2$), aluminum (Al), gallium (Ga), Indium (In), and the like, and may form the dopant-depleted-poly (DDP) regions 1345 and 1445, and the DDSDE regions 1350 and 1450, appropriate for the fabrication of an NMOS transistor 1500, as shown in FIG. 15, for example.

Any of the above-disclosed embodiments of a method for fabricating a semiconductor device according to the present invention provides for increased operating speed and performance of the semiconductor device. Additionally, the present invention allows formation of semiconductor devices with decreased Miller capacitance and increased switching speed, increasing the operating speed of the semiconductor devices and allowing more drive current.

Furthermore, the above-disclosed embodiments of methods for semiconductor device fabrication according to the present invention enable semiconductor device fabrication with increased device density and precision, and enable a streamlined and simplified process flow. For example, no additional masking steps are required to form the dopant-depleted-poly (DDP) regions and the DDSDE regions in an MOS transistor. This decreases the complexity, and lowers the costs, of the manufacturing process, increasing reliability end throughput.

The particular embodiments disclosed above illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed is:

1. A method comprising:
   forming a gate dielectric above a surface of the substrate;
   forming a doped-poly gate structure above the gate dielectric, the doped-poly gate structure having an edge region; and
   forming a first dopant-depleted region in the edge region of the doped poly gate structure adjacent the gate dielectric and a second dopant-depleted region in the substrate under the edge region of the doped-poly gale structure.

2. The method of claim 1, wherein forming the first and second dopant-depleted regions includes depleting the edge region of the doped-poly gate structure adjacent the gate dielectric by forming depleting dielectric spacers adjacent the doped-poly gate structure and depleting the substrate under the edge region of the doped-poly gate structure by forming the depleting dielectric spacers.

3. A method comprising:
   forming a gate dielectric above a surface of the substrate;
   forming a doped-poly gate structure above the gate dielectric, the doped-poly gate structure having an edge region; and
   forming a first dopant-depleted region in the edge region of the doped-poly gate structure adjacent the gate dielectric and a second dopant-depleted region in the substrate under the edge region of the doped-poly gate structure, wherein forming the first dopant-depleted region includes implanting a counter-dopant into the edge region of the doped-poly gate structure adjacent the gale dielectric, and forming the second dopant-depleted region includes implanting the counter-dopant into the substrate under the edge region of the doped-poly gate structure.

4. The method of claim 3, the method further comprising:
   implanting the counter-dopant at an angle $\alpha$ with respect to a direction perpendicular to the surface, wherein the angle $\alpha$ is in a range of about 7°–45°;
   rotating the substrate through at least one of approximately 90° (approximately $\pi/2$ radians), approximately 180° (approximately $\pi$ radians), and approximately 270° (approximately $3\pi/3$ radians); and
   implanting the counter-dopant at the angle $\alpha$ with respect to the direction perpendicular to the surface.

5. The method of claim 3, the method further comprising forming a photoresist mask defining a source/drain extension (SDE) adjacent the doped-poly gate structure.

6. The method of claim 4, the method further comprising forming a photoresist mask defining a source/drain extension (SDE) adjacent the doped-poly gate structure.

7. The method of claim 3, wherein implanting the counter-dopant into the edge region of the doped-poly gate structure and the substrate under the edge region includes implanting one of phosphorus, arsenic, boron and boron fluoride into the edge region of the doped-poly gate structure and the substrate under the edge region, a dose of the one of phosphorus, arsenic, boron and boron fluoride ranging from about $1.0 \times 10^{14}$ ions/cm2 to about $10 \times 10^{15}$ ions/cm2 at an implant energy ranging from about 0.2–5 keV.

8. The method of claim 4, wherein implanting the counter-dopant into the edge region of the doped-poly gate structure and the substrate under the edge region includes implanting one of phosphorus, arsenic, boron and boron fluoride into the edge region of the doped-poly gate structure and the substrate under the edge region, a dose of the one of phosphorus, arsenic, boron and boron fluoride ranging from about $1.0 \times 10^{14}$ ions/cm2 to about $10 \times 10^{15}$ ions/cm2 at an implant energy ranging From about 0.2–5 keV.

9. A method comprising:
   forming a gate dielectric above a surface of the substrate;
   forming a doped-poly gate structure above the gate dielectric, the doped-poly gate structure having an edge region;
   forming a first dopant-depleted region to the edge region of the doped-poly structure adjacent the gate dielectric and a second dopant-depleted region in the substrate under the edge region of the doped-poly gate structure; and
   forming a photoresist mask defining a source/drain extension (SDE) adjacent the doped-poly gate structure.

10. A method comprising:
    forming a gate dielectric above a surface of the substrate;
    forming a doped-poly gate structure above the gate dielectric, the doped-poly gate structure having an edge region; and
    forming a first dopant-depleted region in the edge region of the doped-poly gate structure adjacent the gate dielectric and a second dopant-depleted region in the substrate under the edge region of the doped-poly gate structure, wherein forming the first dopant-depleted-region in the edge region of the doped-poly gate structure includes forming the first dopant-depleted region to have a depth from the edge of the doped-poly gate structure, the depth of the first dopant-depleted region ranging from about 50 Å–100 Å.

11. A method comprising:
    forming a gate dielectric above a surface of a substrate;
    forming a doped-poly gate structure above the gate dielectric, the doped-poly gate structure having an edge region;
    forming a source/drain extension (SDE) adjacent the doped-poly gate structure; and
    forming a dopant-depleted-poly region in the edge region of the doped-poly gate structure adjacent the gate dielectric and a dopant-depleted-SDE region in the substrate under the edge region of the doped-poly gate structure.

12. The method of claim 11, wherein forming the dopant-depleted-poly region includes depleting the edge region of the doped-poly gate structure adjacent the gate dielectric by forming depleting dielectric spacers adjacent the doped-poly gate structure, and forming the dopant-depleted-SDE-region includes depleting the SDE in the substrate under the edge region of the doped-poly gate structure by forming the depleting dielectric spacers above the SDE.

13. A method comprising:
    forming a gate dielectric above a surface of a substrate;
    forming a doped-poly gate structure above the gate dielectric, the doped-poly gate structure having an edge region;
    forming a source/drain extension (SDE) adjacent the doped-poly gate structure; and
    forming a dopant-depleted-poly region in the edge region of the doped-poly gate structure adjacent the gate dielectric and a dopant-depleted-SDE region in the substrate under the edge region of the doped-poly gate structure, wherein forming the dopant-depleted-poly region includes implanting a counter-dopant into the edge region of the doped-poly gate structure adjacent the gate dielectric, and forming the dopant-depleted- SDE region includes implanting the counter-dopant into the substrate under the edge region of the doped-poly gate structure.

14. The method of claim 13, the method further comprising:
   implanting the counter-dopant at an angle α with respect to a direction perpendicular to the surface, wherein the angle α is in a range of about 7°–45°;
   rotating the substrate through at least one of approximately 90° (approximately π/2 radians), approximately 180° (approximately π radians), and approximately 270° (approximately 3π/2 radians); and
   implanting the counter-dopant at the angle α with respect to the direction perpendicular to the surface.

15. The method of claim 13, the method further comprising forming a photoresist mask defining the SDE adjacent the doped-poly gate structure.

16. The method of claim 14, the method further comprising forming a photoresist mask defining the SDE adjacent the doped-poly gate structure.

17. The method of claim 13, wherein implanting the counter-dopant into the edge region of the doped-poly gate structure includes implanting one of phosphorus, arsenic, boron and boron fluoride into the edge region of the doped-poly gate structure, and implanting the counter-dopant into the substrate under the edge region of the doped-poly, gate structure includes implanting the one of phosphorus, arsenic, boron and boron fluoride into the substrate under the edge region of the doped-poly gate structure, a dose of the one of phosphorus, arsenic, boron and boron fluoride ranging from about 1.0×1014 ions/cm2 to about 1.0×1015 ions/cm2 at an implant energy ranging from about 0.2–5 keV.

18. The method of claim 14, wherein implanting the counter-dopant into the edge region of the doped-poly gate structure includes implanting one of phosphorus, arsenic, boron and boron fluoride into the edge region of the doped-poly gate structure, and implanting the counter-dopant into the substrate under the edge region of the doped-poly gate structure includes implanting the one of phosphorus, arsenic, boron and boron fluoride into the substrate under the edge region of the doped-poly gate structure, a dose of the one of phosphorus, arsenic, boron and boron fluoride ranging from about 1.0×1014 ions/cm2 to about 1.0×1015 ions/cm2 at an implant energy ranging from about 0.2–5 keV.

19. A method comprising:
   forming a gate dielectric above a surface of a substrate;
   forming a doped-poly gate structure above the gate dielectric, the doped-poly gate structure having an edge region;
   forming a source/drain extension (SDE) adjacent the doped-poly gate structure;
   forming a dopant-depleted-poly region in the edge region of the doped-poly gate structure adjacent the gate dielectric and a dopant-depleted-SDE region in the substrate under the edge region of the doped-poly gate structure, and
   forming a photoresist mask defining the SDE adjacent the doped-poly gate structure.

20. A method comprising:
   forming a gate dielectric above a surface of a substrate;
   forming a doped-poly gate structure above the gate dielectric, the doped-poly gate structure having an edge region;
   forming a source/drain extension (SDE) adjacent the doped-poly gate structure and
   forming a dopant-depleted-poly region in the edge region of the doped-poly gate structure adjacent the gate dielectric and a dopant-depleted-SDE region in the substrate under the edge region of the doped-poly gate structure, wherein forming the dopant-depleted-poly region in the edge region of the doped-poly gate structure includes forming the dopant-depleted-poly region to have a first depth from the edge of the doped-poly gate structure, the first depth ranging from about 50 Å–100 Å, and forming the dopant-depleted SDE region in the substrate under the edge region of the doped-poly gate structure includes forming the dopant-depleted-SDE region to have a second depth from the surface of the substrate, the second depth ranging from about 50 Å–100 Å.

21. A method, comprising:
   forming a gate dielectric above a surface of a semiconductor substrate;
   forming a doped-poly gate structure above the gate dielectric, the doped-poly-gate structure having an edge region; and
   forming a first dopant-depleted region in the edge region of the doped-poly gate structure adjacent the gate dielectric and a second dopant-depleted depleted region in the substrate under the edge region of the doped-poly gate structure by:
      implanting a counter-dopant into the edge region of the doped-poly gate structure adjacent the gate dielectric; and
      forming depleting dielectric spacers adjacent the doped-poly gate structure.

* * * * *